(12) United States Patent
Feng

(10) Patent No.: US 7,598,798 B2
(45) Date of Patent: Oct. 6, 2009

(54) TRIMMER DEVICE AND RELATED TRIMMING METHOD

(75) Inventor: Chieh-Min Feng, Chu Pei (TW)

(73) Assignee: Realtek Semiconductor Corp., Hsinchu (TW)

( * ) Notice: Subject to any disclaimer, the term of this patent is extended or adjusted under 35 U.S.C. 154(b) by 18 days.

(21) Appl. No.: 11/826,455

(22) Filed: Jul. 16, 2007

(65) Prior Publication Data

US 2008/0012625 A1    Jan. 17, 2008

(30) Foreign Application Priority Data

Jul. 17, 2006    (TW) .............................. 95125975 A

(51) Int. Cl.
*G05F 3/08*    (2006.01)
*H03K 17/18*    (2006.01)

(52) U.S. Cl. ...................................... 327/538; 327/525

(58) Field of Classification Search ........................ None
See application file for complete search history.

(56) References Cited

U.S. PATENT DOCUMENTS

| | | | | |
|---|---|---|---|---|
| 5,099,148 A | * | 3/1992 | McClure et al. ............... | 326/86 |
| 6,121,820 A | * | 9/2000 | Shishikura ................... | 327/525 |
| 6,531,914 B2 | * | 3/2003 | Kawakubo ................... | 327/541 |
| 6,703,885 B1 | | 3/2004 | Fan et al. | |
| 6,949,971 B2 | * | 9/2005 | Jang ........................... | 327/541 |
| 7,420,407 B2 | * | 9/2008 | Kim ........................... | 327/525 |
| 2008/0012624 A1 | * | 1/2008 | Kamatani ................... | 327/525 |

* cited by examiner

*Primary Examiner*—Lincoln Donovan
*Assistant Examiner*—Terry L Englund
(74) *Attorney, Agent, or Firm*—Muncy, Geissler, Olds & Lowe, PLLC

(57) ABSTRACT

A trimmer device for adjusting a reference signal of a target circuit is disclosed. The trimmer device includes: a switch controlling module and an impedance adjustment circuit. The switch controlling module includes: a fuse, selectively being melted according to the reference signal; and a control signal generating circuit, for generating a control signal according to the melting condition of the fuse. The impedance adjustment circuit includes: a switch module, being selectively conductive according to the control signal; and an impedance network, for determining an equivalent impedance of the impedance network according to the conducting condition of the switch module to further adjust the reference signal.

9 Claims, 2 Drawing Sheets

TRIMMER DEVICE AND RELATED TRIMMING METHOD

BACKGROUND OF THE INVENTION

1. Field of the invention

The present invention relates to a trimmer device and a trimming method, and more particularly, to a trimmer device and a trimming method using switches to control an equivalent impedance value.

2. Description of the Related Art

Due to variances in fabrication, circuit characteristics such as resistance or capacitances may shift away from ideal values during the manufacture of integrated circuits. The above-mentioned variances in circuit characteristics may reduce the operation efficiency of circuits. In other cases, these variances may even cause malfunction during the circuits' operation.

However, during chip packaging, it is nearly impossible to adjust every chip device if time and cost are issues of concern. Please note that, for the perspective of an analog circuit, a primary goal is to maintain the value of reference signals residing in the integrated circuit (IC) in order that the values are equalized to the ideal values of the original circuit design. (For example, this is to maintain the voltage levels of specific nodes.) Therefore, a mechanism for performing the aforementioned adjusting operation is necessary for those skilled in the field of the art.

Please refer to FIG. 1. FIG. 1 is a diagram of a conventional trimmer device 100. As shown in FIG. 1, the trimmer device 100 is utilized to adjust the reference voltage $V_F$ of the target circuit 110. The trimmer device 100 comprises three serial-connected resistors 120, 130, and 140 and three fuses 150, 160, and 170. As shown in FIG. 1, the conducting conditions of the fuses 150, 160, and 170 determine the equivalent impedance value of the resistors 120, 130, and 140. In other words, if the fuses 150, 160, and 170 are not melted, each of the fuses 150, 160, and 170 will act as a short circuit. During this time, corresponding resistances of the resistors 120, 130, and 140 are ignored.

On the other hand, if one of the fuses 150, 160, and 170 is melted, one corresponding resistor among the resistors 120, 130, and 140 will be conductive (i.e., the electric current can pass through the corresponding resistor), and a voltage can be generated across the corresponding resistor. Therefore, the voltage level of the reference voltage $V_F$ can still be further adjusted.

Furthermore, please refer to FIG. 2. FIG. 2 is a diagram of another conventional trimmer device 200. The trimmer device 200 is similar to the trimmer device 100. The difference between them is that the resistors 220, 230, and 240 and the fuses 250, 260, and 270 are connected in series respectively. The operation and function of the trimmer device 200 is similar to that of the trimmer device 100. The trimmer device 200 also manipulates the equivalent impedance of the resistors 220, 230, and 240 by using the conducting condition such that the voltage level of the reference voltage $V_F$ can be adjusted.

Through the above-mentioned mechanism, during chip packaging, the manufacturer can utilize an external testing device (not shown) to detect the reference voltage. Additionally, the testing device can detect other reference signals. For example, the testing device can input a testing voltage and then detect a testing current corresponding to the testing voltage. The testing device can select some of the fuses 150, 160, and 170, which are to be melted, according to the variance of the reference voltage. In this way, the equivalent impedance provided by the resistors 120, 130, and 140 can be adjusted such that the reference voltage is also adjusted to the ideal value of the original circuit design.

Unfortunately, the above-mentioned trimmer devices 100 and 200 have some disadvantages. First, sometimes the fuses are not melted completely. So these fuses, which are not melted completely, have resistances. In this way, the resistance provided by the partially melted fuses may correspondingly influence the voltage level of the reference voltage $V_F$. This situation prevents the original trimmer device from operating correctly. In addition, in the above-mentioned trimming mechanism, the equivalent impedance provided by the resistors can only be adjusted upward. Therefore, if the resistance of the target circuit is larger than the ideal value, the above-mentioned trimmer device is not capable of improving the situation. At this time, in order to raise the yield of the chip, the resistance of the target circuit has to be assigned a lower value when the chip is designed, where the lower value is lower than the ideal value. In this way, during chip packaging, the trimmer device is utilized to adjust the resistance upward to the ideal value. However, the above-mentioned trimming mechanism makes the adjustment of all chips necessary. Therefore, although the yield can be increased, a lot of time and costs are required using this method.

SUMMARY OF THE INVENTION

In view of the above-mentioned problems, an object of the claimed invention is to provide a trimmer device and related trimming method.

According to an embodiment of the claimed invention, a trimmer device for adjusting a reference signal of a target circuit is disclosed. The trimmer device comprises: a switch controlling module, and an impedance adjusting circuit. The switch controller includes: a fuse, selectively melted according to an ideal value of the reference signal; and a control signal generating circuit, for generating a control signal according to a conducting condition of the fuse. The impedance adjusting circuit comprises: a switch module, for selectively conductive according to the control signal; and an impedance network, for determining an equivalent impedance of the impedance network according to a conducting condition of the switch module such that the reference signal is adjusted.

According to another embodiment of the claimed invention, a trimming method for adjusting a reference signal of a target circuit is disclosed. The trimming method utilizes a switch control module, the switch control module comprises: a fuse and a control signal generating circuit, and the trimming method includes: determining a conducting condition of the fuse according to the reference signal by using the control signal generating circuit for generating a control signal; and controlling an equivalent impedance of an impedance network, according to the control signal such that the reference signal is adjusted.

The claimed invention trimmer device can control the reference signal or the equivalent impedance of the entire circuit by controlling switches. In contrast to the prior art control mechanism utilizing fuses, the claimed invention trimmer device is more flexible, and allows the reference signal or the equivalent impedance to be adjusted upward and downward. Therefore, the chip is designed in the typical way without purposely reducing the impedance of the target circuit to meet the demand of yield. In this way, when the chip is being packaged, the claimed invention trimmer device only has to adjust the target circuit, which has an incorrect impedance value (i.e., reference signal). Therefore, the claimed invention can reduce packaging costs and time.

DETAILED DESCRIPTION OF THE INVENTION

Figure 1:
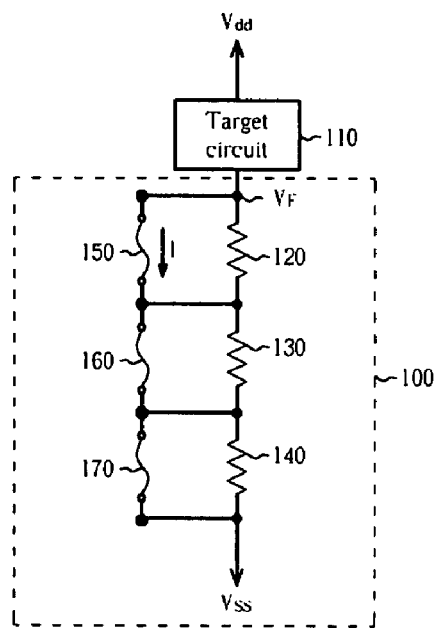
FIG. 1 is a diagram of a conventional trimmer device.
Figure 2:
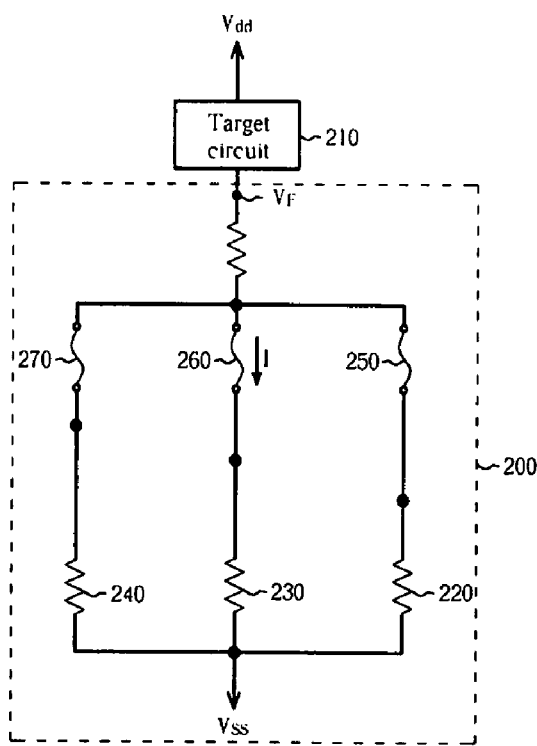
FIG. 2 is a diagram of a second conventional trimmer device.
Figure 3:
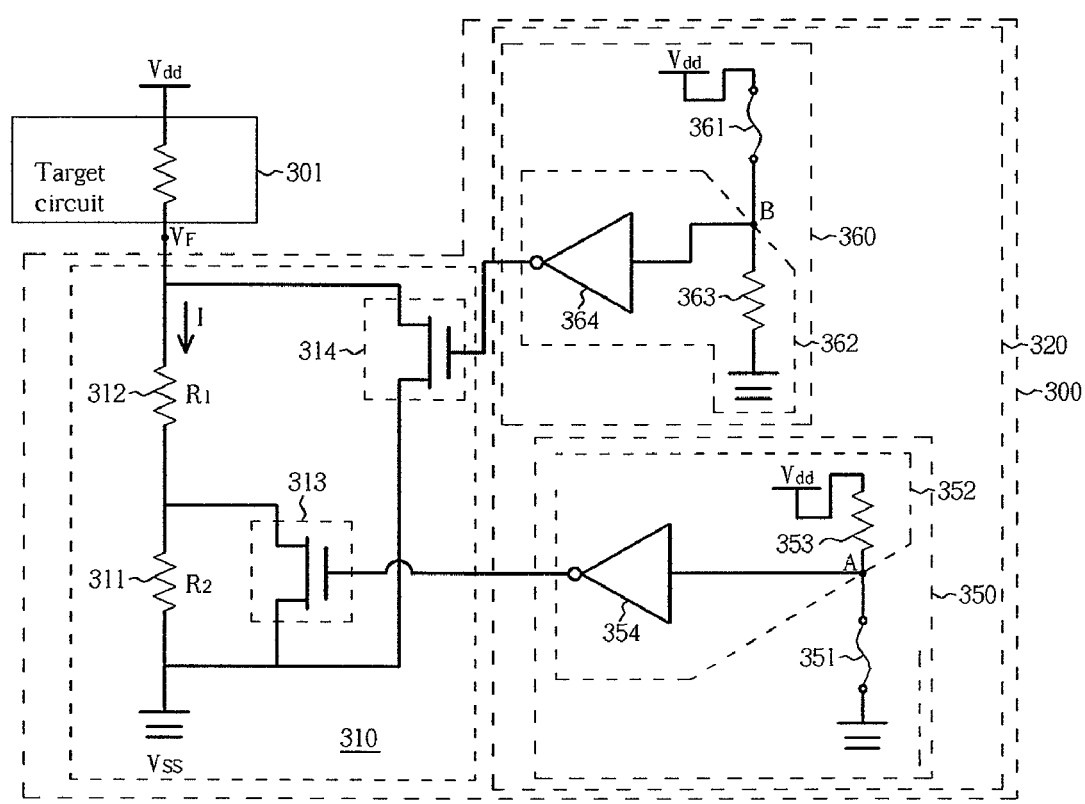
FIG. 3 is diagram of a trimmer device according to the present invention.

Please refer to FIG. 3, which is diagram of a trimmer device 300 according to the present invention. As shown in FIG. 3, trimmer device 300 comprises an impedance adjusting circuit 310 and a switch controlling module 320. The impedance adjusting circuit 310 comprises a plurality of resistors 311 and 312 and a plurality of transistors 313 and 314. The electronic connections among the above-mentioned devices are shown in FIG. 3, and thus omitted herein for the sake of brevity. Please note that, in this embodiment of the present invention, the transistors 313 and 314 are utilized as switches.

The switch controlling module 320 is utilized to control the switches 313 and 314 (i.e., to control the conducting conditions of the switches 313 and 314) to adjust the equivalent resistance of the resistors 311 and 312 such that the reference signal $V_F$ can be further adjusted. It is noted that, because the present invention trimmer device 300 utilizes the characteristics of the switches to control the equivalent impedance of the resistors 311 and 312, the trimmer device 300 can achieve comparatively better design flexibilities. For example, as long as the initial conducting conditions of the switches 313 and 314 are appropriately predetermined, the equivalent impedance of the trimmer device 300 can be adjusted upward (i.e., the equivalent impedance increases), and also adjusted downward (i.e., the equivalent impedance decreases). In other words, the voltage level $V_F$ of the reference signal $V_F$ can be adjusted upward or downward. Therefore, in this embodiment of the present invention, the initial conducting condition of the switch 313 is on, and the initial conducting condition of the switch 314 is off. In this way, if the resistance of target circuit 301 is less than an ideal value, the switch controlling module 320 can turn off the switch 313. In this way, the equivalent impedance becomes a larger value R1+R2. On the other hand, if the resistance of the target circuit 301 is greater than the ideal value, the switch controlling module 320 can turn on the switch 314 such that the equivalent impedance becomes a smaller resistance 0.

Please note that, in this embodiment, the initial conducting conditions of the switches 313 and 314 are provided as an illustration for the embodiment, and are not a limitation of the present invention. In the actual implementation, the circuit designer can assign the initial conducting conditions of the switches 313 and 314 according to the requirements at hand. For example, the switches 313 and 314 can both be on initially. This change also obeys the spirit of the present invention.

In order to achieve the above-mentioned mechanism, the switch controlling module 320 comprises two switch controlling units 350 and 360, which are respectively coupled to the switches 313 and 314, for controlling (i.e., switching) the switches 313 and 314.

Please refer to FIG. 3 again. The switch controlling unit 350 comprises a fuse 351 and a control signal generating circuit 352. The control signal generating circuit 352 comprises a resistor 353 and an inverter 354. As shown in FIG. 3, the fuse 351 is coupled between the node A and the ground voltage, the resistor 353 is coupled between the node A and a high voltage level, the input end of the inverter 354 is coupled to the node A, and the output node of the inverter 354 is coupled to the switch 313 (i.e., the gate of the transistor 313).

In this embodiment of the present invention, when the trimmer device 300 is in the initial condition, the fuse 351 has not yet melted. At this time, the voltage level of the node A corresponds to the ground level (i.e., logic 0). Next, after the inverter 354 performs the inverting operation, the control signal generating circuit 352 provides a high voltage level (i.e., logic 1) to the gate of the transistor 313 such that the transistor 313 is turned on.

On the other hand, the switch controlling unit 360 is similar to the switch controlling unit 350. The switch controlling unit 360 comprises a fuse 361 and a control signal generating circuit 362. The control signal generating circuit 362 comprises a resistor 363 and an inverter 364. As shown in FIG. 3, the fuse 361 is coupled between the node B and a high voltage level, the resistor 363 is coupled between the node B and the ground voltage, and the input end of the inverter 364 is coupled to the node B, and the output end of the inverter 364 is coupled to the switch 314 (i.e., the gate of the transistor 314).

In this embodiment of the present invention, when the trimmer device 300 is in the initial condition, the fuse 361 has not yet melted. At this time, the voltage level of the node B corresponds to the high voltage level (i.e., logic 1). Next, after the inverter 364 performs the inverting operation, the control signal generating circuit 362 provides a low voltage level (i.e., logic 0) to the gate of the transistor 314 such that the transistor 314 is turned off.

Under the control of the switch controlling module 320, as mentioned previously, in the initial condition, the equivalent impedance provided by the impedance adjusting circuit 310 is equal to the resistance R1, which is provided by the resistor 312.

During chip packaging, an external testing device (not shown in FIG. 3) can detect whether the reference voltage $V_F$ or other reference signals comply with the ideal values. For example, the testing device can input a testing voltage and then measure a corresponding current such that the impedance of the target circuit 301 can be calculated. If the reference voltage $V_F$ is lower than an ideal value (i.e., the impedance of the target circuit 301 is lower than an ideal value), the testing device can melt the fuse 351 of the switch controlling unit 350. In this way, the voltage level of the node A corresponds to a high voltage level, and the gate of the transistor 313 corresponds to a ground voltage. Therefore, the switch 313 is turned off. This makes the equivalent impedance become a higher value R1+R2, and the reference voltage $V_F$ is thereby increased.

On the other hand, if the reference voltage $V_F$ is higher than an ideal value (i.e., the resistance of the target circuit 301 is greater than an ideal value); the testing device can melt the fuse 361 of the switch controlling unit 360. In this way, the voltage level of the node B corresponds to a ground voltage, and the gate of the transistor 314 corresponds to a high voltage level. Therefore, the switch 314 is turned on. This makes the equivalent impedance become a lower value 0, and the reference voltage $V_F$ is thereby reduced.

Please note that, the above-mentioned circuit configuration illustrates an embodiment of the present invention and is not a limitation of the present invention. For example, in order to adjust the resistance or the reference signals more precisely, the present invention trimmer device can comprise additional resistors and, corresponding to the resistors, additional switch controlling units. Furthermore, the internal devices of the trimmer device can be coupled in different ways, for example, a more complex serial-parallel coupling. Those having average skill in the art readily understand that the trimmer device can be implemented with variant circuits, and the trimmer devices should all obey the spirit of the present invention. Taking the prior art trimmer devices 100 and 200 as examples, the present invention can exchange the fuses with switches and add switch controlling modules, capable of controlling the switches, into the trimmer device 100 and 200. In this way, controlling the adjustment of the reference signal can also be achieved. This change also obeys the spirit of the present invention.

Please note that, in the switch controlling units 350 and 360, the inverters 354 and 364 are utilized to perform a level shifting operation. In other words, if the fuses 351 and 361 are not completely melted such that the voltage levels of the nodes A and B do not correspond to a "clean" high voltage level or ground level, the inverters 354 and 364 can invert the above-mentioned unclean voltage levels into cleaner voltage levels. This ensures that the switches 313 and 314 can be switched correctly.

However, the inverters 354 and 364 can be optional devices. For example, if the fuses 351 and 361 can be melted normally (i.e., the voltage levels of the nodes A and B can correctly be pulled up or down after the fuses 351 and 361 are melted) or the voltage levels of the nodes A and B are sufficient to trigger the switching operation of the switches 313 and 314, the inverters 354 and 364 are no longer needed. In other words, the switch controlling units 350 and 360 need only comprise the resistors 353 and 363 and the fuses 351 and 361. This change also obeys the spirit of the present invention.

In contrast to the prior art, the present invention trimmer device can control the reference signal or the equivalent impedance of the entire circuit through switching switches. Instead of the prior art control mechanism utilizing fuses, the present invention trimmer device is more flexible, and can allow the reference signal or the equivalent impedance to be adjusted upward and downward. Therefore, the chip can be designed without purposely reducing the impedance of the target circuit to meet the demand of yield. In this way, when the chip is being packaged, the present invention trimmer device need only adjust the target circuit, which has an incorrect impedance value (i.e., reference signal). Therefore, the present invention can reduce the packaging costs and time.

While certain exemplary embodiments have been described and shown in the accompanying drawings, it is to be understood that such embodiments are merely illustrative of and not restrictive on the broad invention, and that this invention should not be limited to the specific construction and arrangement shown and described, since various other modifications may occur to those ordinarily skilled in the art.

What is claimed is:

1. A trimmer device for adjusting a reference signal of a target circuit, the trimmer device comprising:
 a switch controlling module comprising:
  a fuse, selectively melted according to an ideal value of the reference signal; and
  a control signal generating circuit, coupled to the fuse, for generating a control signal according to a conducting condition of the fuse; and
 an impedance adjusting circuit, coupled to the target circuit and the switch controlling module, the impedance adjusting circuit comprising:
  a switch module, selectively conductive according to the control signal; and
  an impedance network, coupled to the switch module, for determining an equivalent impedance of the impedance network according to a conducting condition of the switch module such that the reference signal is adjusted;
 wherein the switch module comprises N switch devices, the impedance network comprises N impedance devices, a first impedance device and at least an $N^{th}$ impedance device of the N impedance devices are connected in series, a first switch device of the N switch devices is connected in parallel with the first impedance device, an $N^{th}$ switch device of the N switch devices is connected in parallel with the serially connected first impedance device and at least the $N^{th}$ impedance device, wherein N is an integer greater than 1.

2. The trimmer device of claim 1, wherein at least one of the N impedance devices is a resistor.

3. The trimmer device of claim 1, wherein at least one of the N switch devices is implemented with a transistor.

4. The trimmer device of claim 1, wherein the fuse is coupled between a first voltage level and an input end of the control signal generating circuit, and the control signal generating circuit comprises another impedance device, coupled between a second voltage level and the input end.

5. The trimmer device of claim 4, wherein the first voltage level is a high voltage level representing logic 1 and the second voltage level is a low voltage level representing logic 0.

6. The trimmer device of claim 4, wherein the first voltage level is a low voltage level representing logic 0 and the second voltage level is a high voltage level representing logic 1.

7. The trimmer device of claim 1, wherein the fuse is coupled between a first voltage level and a node, and the control signal generating circuit comprises:
 another impedance device, coupled between a second voltage level and the node; and an inverter, having an input end and an output end, the input end coupled to the node and the output end coupled to the switch module.

8. The trimmer device of claim 7, wherein the first voltage level is a high voltage level representing logic 1 and the second voltage level is a low voltage level representing logic 0.

9. The trimmer device of claim 7, wherein the first voltage level is a low voltage level representing logic 0 and the second voltage level is a high voltage level representing logic 1.

* * * * *